(12) United States Patent
Watanabe et al.

(10) Patent No.: US 6,743,708 B2
(45) Date of Patent: Jun. 1, 2004

(54) METHOD OF MANUFACTURING SEMICONDUCTOR DEVICE INCLUDING STEPS OF FORMING GROOVE AND RECESS, AND SEMICONDUCTOR DEVICE

(75) Inventors: Shinya Watanabe, Tokyo (JP); Shunji Yasumura, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/266,608

(22) Filed: Oct. 9, 2002

(65) Prior Publication Data

US 2003/0111668 A1 Jun. 19, 2003

(30) Foreign Application Priority Data

Dec. 19, 2001 (JP) ......................................... 2001-385769
May 27, 2002 (JP) ......................................... 2002-151855

(51) Int. Cl.[7] ......................................... H01L 21/4763
(52) U.S. Cl. ..................... 438/619; 438/620; 438/622
(58) Field of Search ............................... 438/421, 422, 438/619, 620, 622, 253–257, 262

(56) References Cited

U.S. PATENT DOCUMENTS 6,297,145 B1 * 10/2001 Ito ............................... 438/619
6,559,045 B2 * 5/2003 Chung ........................ 438/622

* cited by examiner

*Primary Examiner*—Phat X. Cac
*Assistant Examiner*—Theresa T. Doan
(74) *Attorney, Agent, or Firm*—Oblon, Spivak, McClelland, Maier & Neustadt, PC.

(57) ABSTRACT

An interlayer insulation film (31) on a plug (11) is etched using a silicon nitride film (32) used in pattern etching of a bit line (12) as a hard mask such that the plug (11) projects into a groove (40). Another silicon nitride film (33) is provided to cover an exposed surface of the groove (40), the bit line (12) and the silicon nitride film (32), thereby forming another interlayer insulation film (34) on the silicon nitride film (33) to fill the groove (40). The silicon nitride films (33, 32) are used as an etching stopper to etch the interlayer insulation film (34) above the plug (11). The silicon nitride film (33) on the plug (11) is etched to expose the plug (11) into a recess.

8 Claims, 14 Drawing Sheets

F I G . 7
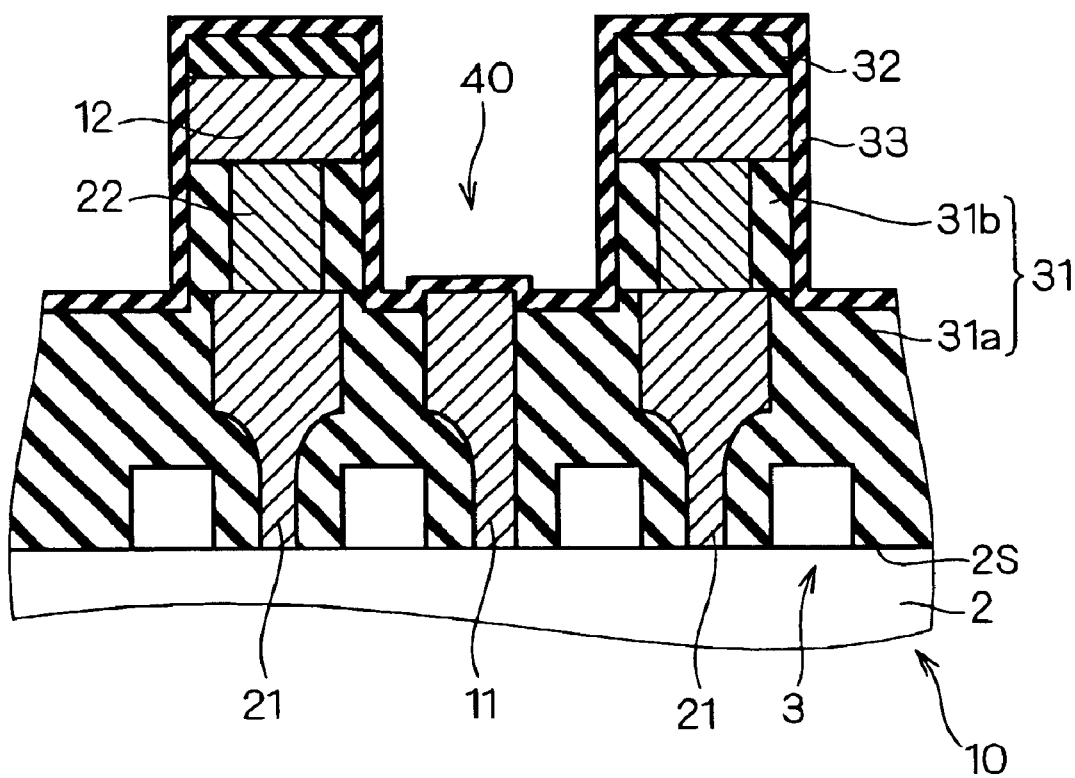

METHOD OF MANUFACTURING SEMICONDUCTOR DEVICE INCLUDING STEPS OF FORMING GROOVE AND RECESS, AND SEMICONDUCTOR DEVICE

BACKGROUND OF THE INVENTION

1. Field of the Invention

The present invention relates to a method of manufacturing a semiconductor device and a semiconductor device, and more particularly to a technique for promoting miniaturization of a semiconductor device.

2. Description of the Background Art

A conventional DRAM has a storage node (SN) contact formed between bit lines (BL). As shown in FIG. 14, a conventional hole 40P for the storage node contact is formed between bit lines 12P as a minute cylindrical hole, for example. This minute hole 40P is provided over a plug 11P for the storage node contact. (Thus, the hole 40P is formed in part of a region defined between the bit lines 12P.)

Now, in reference to FIGS. 15 to 18, a method of forming the hole 40P for the storage node contact using a conventional self-alignment contact (SAC) method will be described.

As shown in FIG. 15, the bit lines 12P are patterned on an interlayer insulation film 31bP using a silicon nitride film 32P serving as a hard mask (HM). A silicon nitride film 33P serving as an etching stopper film is formed on the interlayer insulation film 31bP in such a manner as to cover the hard mask 32P and the bit lines 12P. Thereafter, an interlayer insulation film 34P is formed.

Next, a resist 4P is formed on the interlayer insulation film 34P as shown in FIG. 16. The interlayer insulation film 34P is etched using the resist 4P as a mask and the silicon nitride film 33P as an etching stopper as shown in FIG. 17, following which the silicon nitride film 33P on the interlayer insulation film 31bP is etched. Further, as shown in FIG. 18, the interlayer insulation film 31bP is etched until the plug 11P is exposed.

With advancement in device miniaturization, requirements for the alignment margin between a bit line and a storage node contact, miniaturization of the bit line and the storage node contact, and their dimensional accuracy are becoming stricter. Indeed, the bit lines 12P having a wiring width of not more than 70 nm and the hole 40P for the storage node contact having a hole diameter of not more than 100 nm are becoming difficult to be formed in a stable shape.

Even by using the conventional SAC method, the silicon nitride films 33P and 32P which cover the bit lines 12P may be etched as shown in FIGS. 17 and 18 by causing etching to proceed further until the plug 11P is exposed. In this case, the silicon nitride film 33P may be etched so much that the bit lines 12P are exposed into the hole 40P, which problematically develops a short circuit between the bit lines 12P and a plug (not shown) to be formed in the hole 40P.

SUMMARY OF THE INVENTION

An object of the present invention is to provide a method of manufacturing a semiconductor device capable of etching an insulation film with better controllability than in the above described conventional minute hole.

Another object of the present invention is to provide the method of manufacturing a semiconductor device capable of insulating a conductive portion such as a bit line from another conductive portion with reliability.

Still another object of the invention is to provide a semiconductor device manufactured by the method capable of achieving the above-described two objects.

According to a first aspect of the present invention, the method of manufacturing a semiconductor device includes the following steps (a) to (e). The step (a) is to form a first insulation film on an underlying substrate and to provide a first conductive portion in the first insulation film. The step (b) is to form a conductive film on the first insulation film. The step (c) is to form a second insulation film on the conductive film leaving a space over the first conductive portion. The step (d) is to pattern the conductive film using the second insulation film as a mask to form a second conductive portion. The step (e) is to etch the first insulation film using the second insulation film as a mask after the step (d) to form a groove in the first insulation film.

The first insulation film is etched using the second insulation film formed on the second conductive portion as a mask (thereby forming the groove). Thus, the groove extends through the spacing of plane patterns of the second conductive portion and the second insulation film. Therefore, the groove is formed not only larger than a conventional minute hole formed in part of a region in the above spacing of plane patterns but also in a self-aligned manner. This allows the groove to be formed with better controllability in shape than the conventional minute hole. Further, the use of the second insulation film (as a mask) in common for forming the second conductive portion and the groove allows reductions in manufacturing time and manufacturing costs. Still further, forming the groove which is larger than the conventional minute hole after the step (d) can reduce the extent that the shoulder of the second insulation film is etched as compared to the conventional self-alignment contact method in which the minute hole is formed after forming another insulation film.

According to a second aspect of the present invention, the semiconductor device includes an underlying substrate, a first insulation film, a first conductive portion, a second conductive portion, a second insulation film and a sidewall-shaped insulating portion. The first insulation film is provided on the underlying substrate and has a groove with an opening on the opposite side of the underlying substrate. The first conductive portion is provided in the first insulation film and projects into the groove. The second conductive portion is provided on the first insulation film. The second insulation film is provided on the second conductive portion with the same plane pattern as the second conductive portion. The second conductive portion and the second insulation film have side faces continuing smoothly to a side face of the groove of the first insulation film. The sidewall-shaped insulating portion is provided in contact with a bottom face of the groove and a side face of a projection of the first conductive portion.

When a conductive material is provided on the first conductive portion, the conductive material can cover the first conductive portion with good step coverage thanks to the sidewall-shaped insulating portion. This can ensure an electric contact between the first conductive portion and the conductive material.

According to a third aspect of the present invention, the semiconductor device includes an underlying substrate, a first insulation film, a first conductive portion, a second conductive portion, a second insulation film and a side covering insulating portion. The first insulation film is provided on the underlying substrate and has a groove with an opening on the opposite side of the underlying substrate.

The first conductive portion is provided in the first insulation film and exposes into the groove. The second conductive portion is provided on the first insulation film. The second insulation film is provided on the second conductive portion with the same plane pattern as the second conductive portion. The second conductive portion and the second insulation film have side faces continuing smoothly to a side face of the groove of the first insulation film. The side covering insulating portion extends from at least part of the side face of the second insulation film to at least part of the side face of the groove over the side face of the second conductive portion.

The side face of the second conductive portion is fully covered with the side covering insulating portion, allowing the second conductive portion to be insulated from another conductive portion with more reliability.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 5 through 13 are sectional views showing a method of manufacturing the semiconductor device according to the first preferred embodiment;

DESCRIPTION OF THE PREFERRED EMBODIMENTS

First Preferred Embodiment

Figure 1:
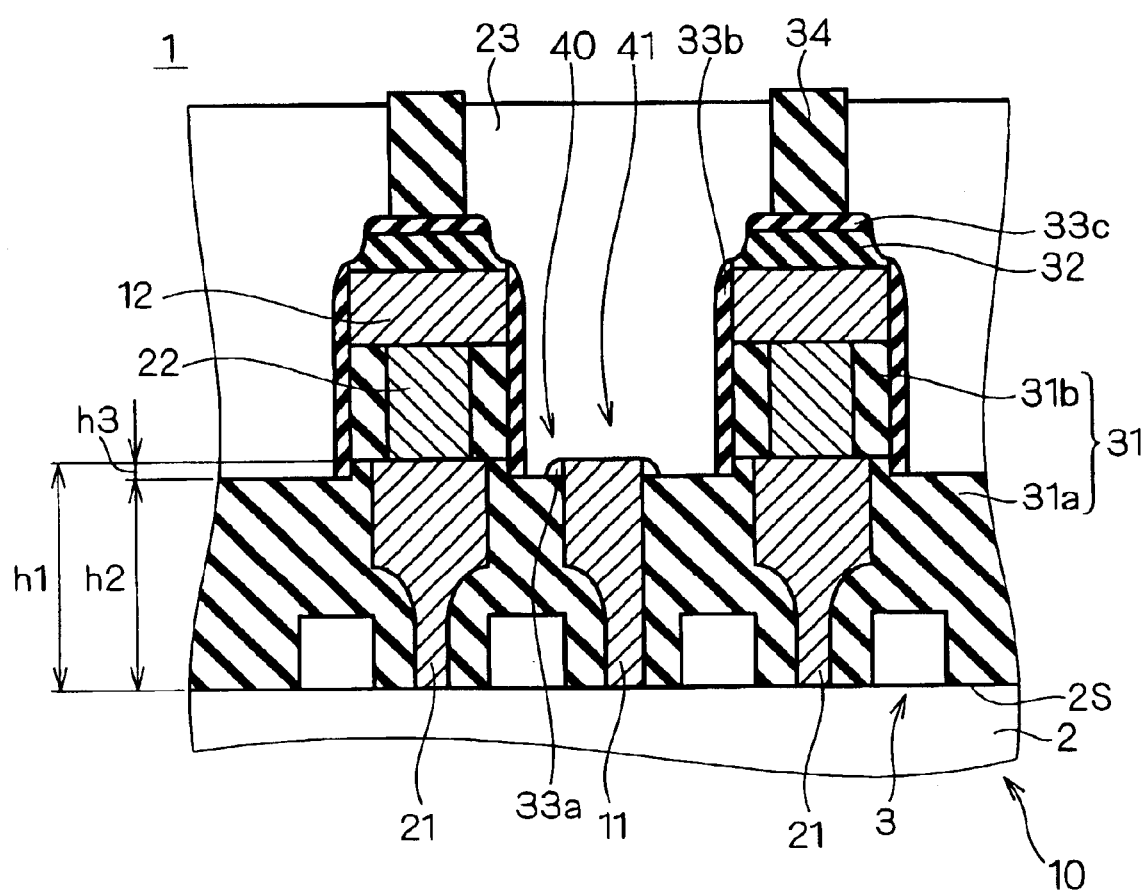
FIG. 1 is a sectional view showing a semiconductor device according to a first preferred embodiment of the present invention.
Figure 2:
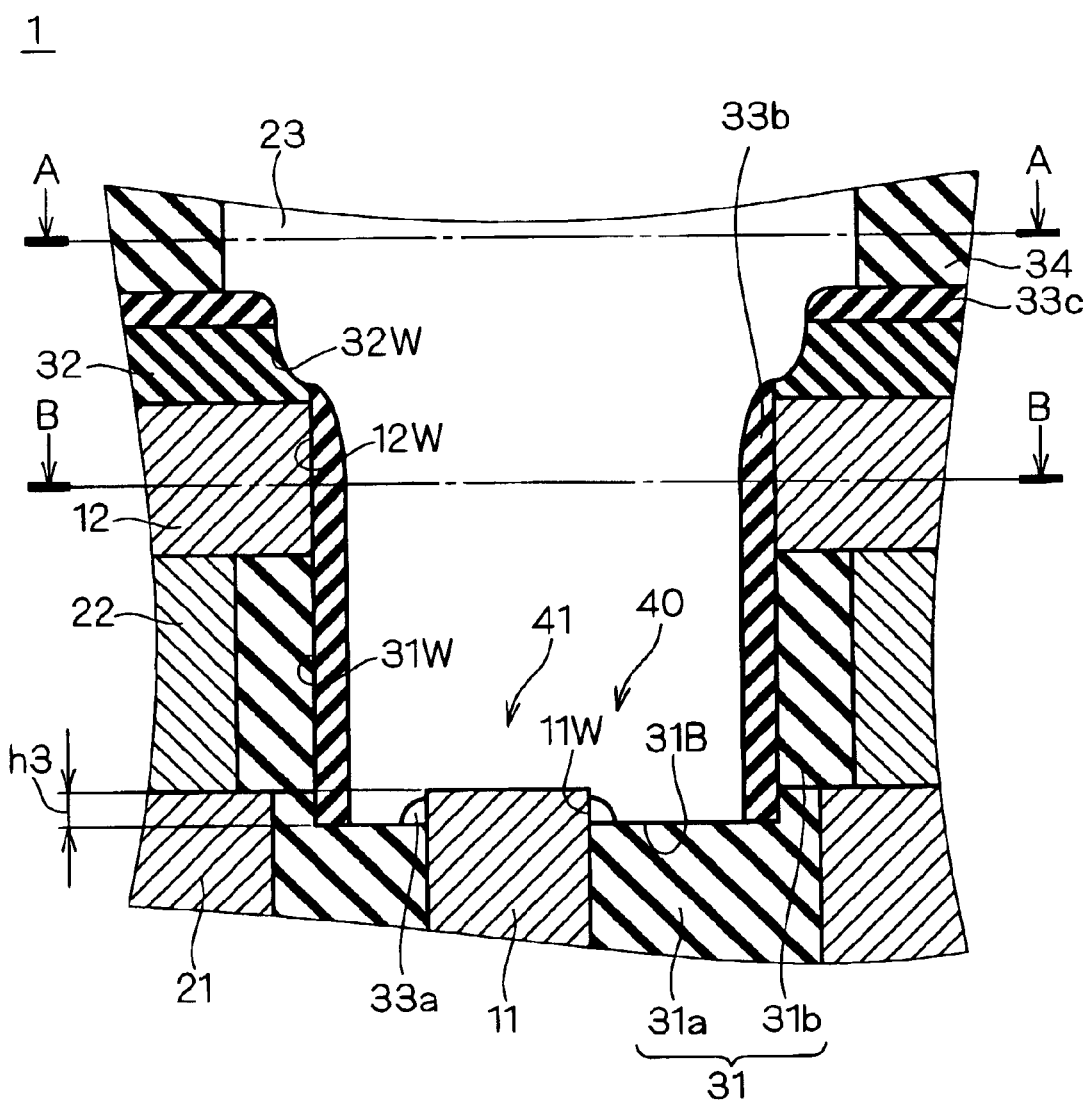
FIG. 2 is an enlarged sectional view showing the semiconductor device according to the first preferred embodiment.
Figure 3:
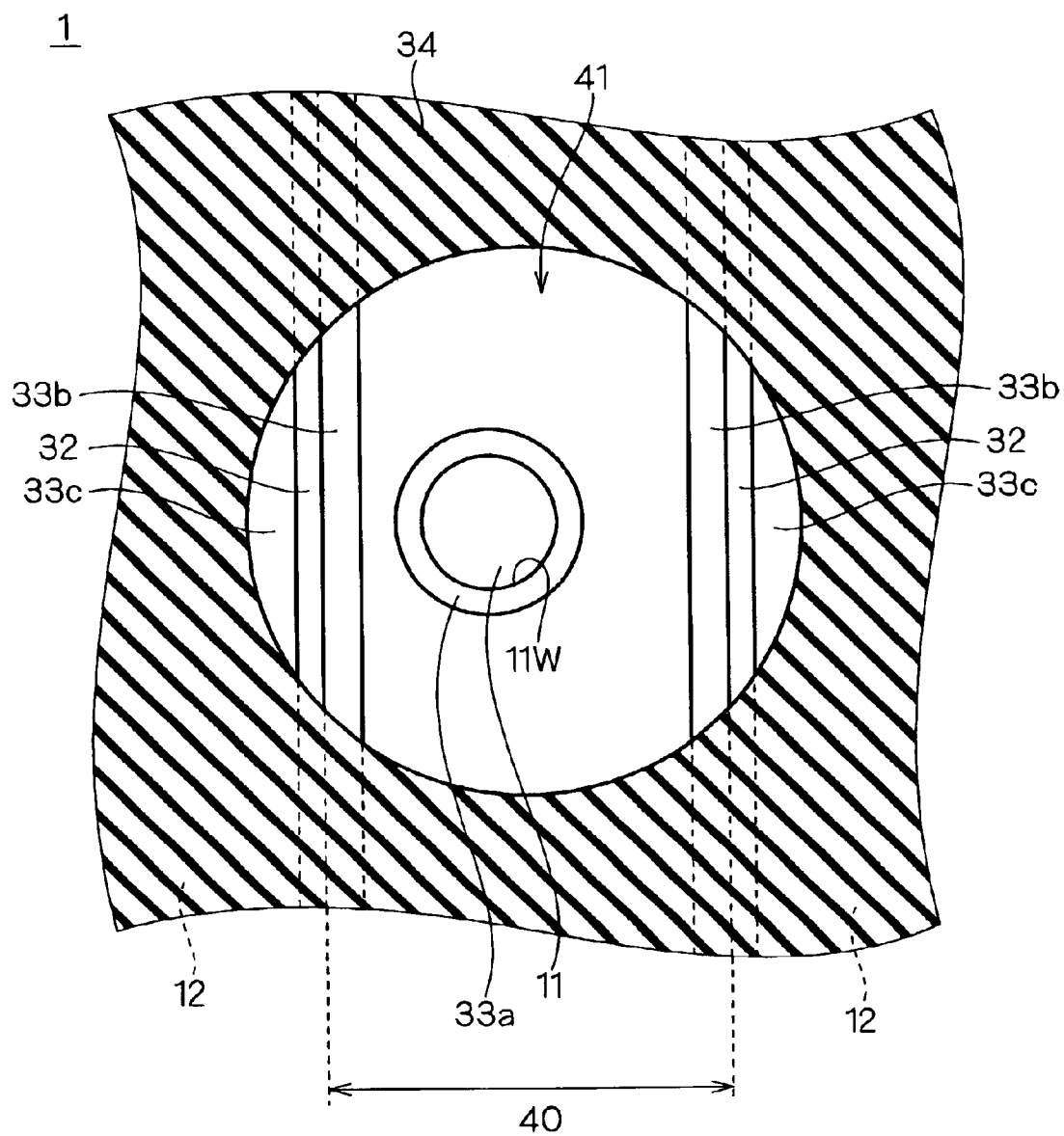
FIG. 3 is a sectional view taken along the line A—A of FIG. 2.
Figure 4:
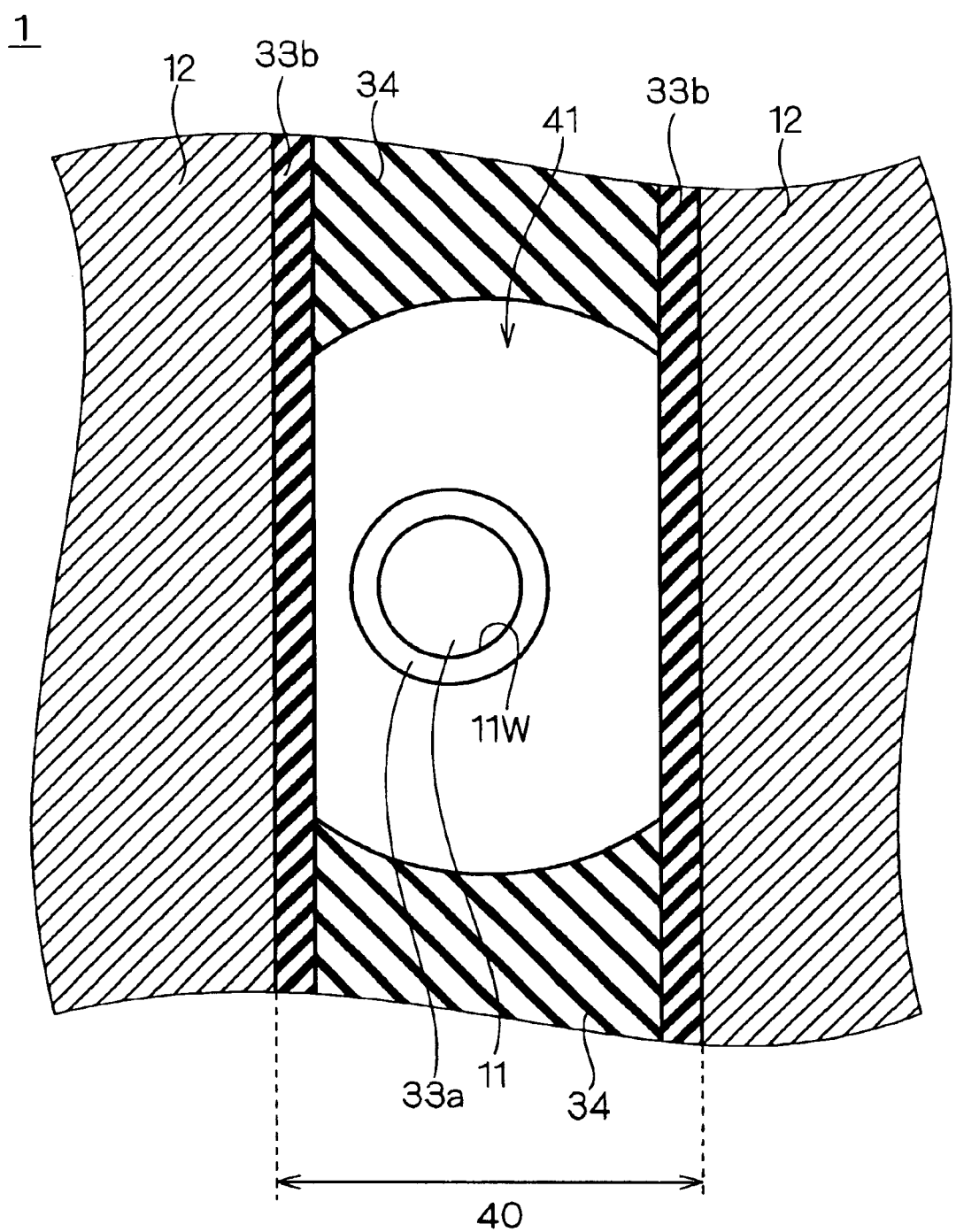
FIG. 4 is a sectional view taken along the line B—B of FIG. 2.

FIG. 1 is a sectional view showing a semiconductor device (e.g., DRAM) 1 according to the first preferred embodiment of the present invention, and FIG. 2 is an enlarged view of part of FIG. 1. FIGS. 3 and 4 are sectional views taken along the lines A—A and B—B of FIG. 2, respectively, i.e., plan views of the semiconductor device 1. For avoiding complexity, illustration of a plug 23 is omitted in FIGS. 3 and 4.

The semiconductor device 1 includes a semiconductor substrate 2 made of silicon, for example, having a surface (hereinafter also referred to as substrate surface) 2S provided with transfer gates 3. In the drawing, the transfer gates 3 are schematically shown by gates of MISFET. A lower interlayer insulation film 31a is formed on the substrate surface 2S to cover the transfer gates 3. An upper interlayer insulation film 31b is formed on the lower interlayer insulation film 31a. The interlayer insulation films 31a and 31b are made of TEOS oxide, for example.

Hereinafter, the two interlayer insulation films 31a and 31b are generically called "interlayer insulation film (or first insulation film) 31". The structure including the semiconductor substrate 2 or the semiconductor substrate 2 and the transfer gates 3 thus can be called "underlying substrate 10" on which the interlayer insulation film 31 is to be formed.

The interlayer insulation film 31 has a groove (trench) 40 with an opening (opening entrance) on the opposite side of the underlying substrate 10. More specifically, the groove 40 extends through the upper interlayer insulation film 31b to reach part of the lower interlayer insulation film 31a (to the depth h3). Therefore, the lower interlayer insulation film 31a has surface irregularities (on the surface opposite to the underlying substrate 10 and on the upper interlayer insulation film 31b side). The height or thickness from the substrate surface 2S to a projected surface and a recessed surface of the lower interlayer insulation film 31a is indicated by h1 and h2 (<h1), respectively, and the difference in height between the projected and recessed surfaces, i.e., the depth h3 at which the groove 40 reaches the lower interlayer insulation film 31a is expressed as h3=h1−h2. The difference h3 is set at not more than approximately 100 nm.

The lower interlayer insulation film 31a is provided with contact holes therein in each of which a plug (or first conductive portion) 11 for a storage node (not shown) or a plug 21 for bit lines (or second conductive portion) 12 is formed. The plugs 11 and 21 are made of polysilicon, for example.

The plug 11 is provided in the interlayer insulation film 31 so as to be in contact with the substrate surface 2S and to expose to the inside of the groove 40 of the interlayer insulation film 31. More specifically, the plug 11 projects from a bottom face 31B (FIG. 2) of the groove 40, with its projected top portion set at the same level as the projected surface of the lower interlayer insulation film 31a (and the plugs 21 to be described later). In other words, the projection height of the plug 11 in the groove 40 is equal to the difference h3 between the projected and recessed surfaces of the lower interlayer insulation film 31a and is set at not more than approximately 100 nm. On the other hand, the plugs 21 for the bit lines 12 are formed in the interlayer insulation film 31 to be in contact with the substrate surface 2S and to reach the projected surface of the lower interlayer insulation film 31a (i.e., the interface between the lower and upper interlayer insulation films 31a and 31b). The plugs 11 and 21 both have the height h1 from the substrate surface 2S.

The bit lines or bit line layer with a predetermined pattern (or second conductive portion) 12 and a silicon nitride film (or second insulation film) 32 are formed in this order on the upper interlayer insulation film 31b, i.e., on the projected surface of the interlayer insulation film 31 (thus, outside the groove 40). The bit line 12 is made of polysiticon or tungsten, for example. Plugs 22 each electrically connecting the pattern of the bit line 12 and the plug 21 are formed in the interlayer insulation film 31.

Particularly, as shown in FIG. 2, a side face 12W of the bit line 12 and a side face 32W of the silicon nitride film 32 (specifically, part of the side face 32W on the bit line 12 side) continues smoothly to an inner side face 31W of the groove 40 formed in the interlayer insulation film 31 (without a steep difference in step). The interlayer insulation film 31, the bit line layer 12 and the silicon nitride film 32 forms a groove continuing from and deeper than the groove 40 formed in the interlayer insulation film 31. Here, the projected surface (or projected portion) of the interlayer insulation film 31, the bit line layer 12 and the silicon nitride film 32 have the same plane pattern in a plane view of the substrate surface 2S or the underlying substrate 10.

A side covering insulating portion 33b is formed to be in contact with the silicon nitride film 32, the bit line 12 and the groove 40. More specifically, the side covering insulating portion 33b extends from part of the side face 32W of the silicon nitride film 32 to the entire side face 31W of the groove 40 over the side face 12W of the bit line 12. The side covering insulating portion 33b is made of silicon nitride, for example, having a thickness (i.e., the dimension in a direction perpendicular to the side faces 32W, 12W and 31W or in parallel to the substrate surface 2S) of not more than approximately 10 nm.

An insulating portion (hereinafter also referred to as "sidewall-shaped insulating portion") 33a having the same shape as a sidewall of the MISFET is further provided in the groove 40 to be in contact with the bottom face 31B of the groove 40 and a side face (or projected side face) 11W of the projected portion of the plug 11. The sidewall-shaped insulating portion 33a is made of silicon nitride, for example, similarly to the side covering insulating portion 33b, having a height (i.e., the dimension in a direction perpendicular to the bottom face 31B of the groove 40 or the substrate surface 2S) equal to or below the projection height h3 of the plug 11.

A top insulating portion 33c is further formed on the silicon nitride film 32, having a side face continuing smoothly to the side face 32W of the silicon nitride film 32. The top insulating portion 33c is made of silicon nitride, for example, similarly to the side covering insulating portion 33b, having a similar degree of thickness (i.e., the dimension in a direction perpendicular to the substrate surface 2S) as the portion 33b. The top insulating portion 33c and the side covering insulating portion 33b may be connected to each other on the side face 32W of the silicon nitride film 32.

At this time, the plugs 21, 22, the bit line (layer) 12, the silicon nitride film 32 and the top insulating portion 33c are provided in this order on the substrate surface 2S.

Further provided is an interlayer insulation film (or fourth insulation film) 34, made of TEOS oxide, for example, which fills the groove 40 to further extend over the top insulating portion 33c. That is, the interlayer insulation film 34 extends from the bottom face 31B of the groove 40 to reach a predetermined level of height over the top insulating portion 33c. In the interlayer insulation film 34, a recess 41 is formed which constitutes a contact hole. As shown in FIGS. 3 and 4, the recess 41 surrounds the plug 11 for the storage node and is formed on the plug 11 and the sidewall-shaped insulating portion 33a in a plane view. Not only the plug 11 and the sidewall-shaped insulating portion 33a but also the side covering insulating portion 33b, the silicon nitride film 32 and the top insulating portion 33c are exposed into the recess 41.

A plug 23 for the storage node is provided in the recess 41. More specifically, the plug 23 is in contact with the plug 11, the sidewall-shaped insulating portion 33a and the side covering insulating portion 33b to reach the same level of height as the interlayer insulation film 34. The plug 23 is made of polysilicon, for example. Although FIG. 1 and thee like illustrate one each of the plug 11, 23 and the recess 41 for ease of illustration, a plurality of plugs 11 are provided in the direction perpendicular to the drawing sheet of FIG. 1, i.e., in the top-to-bottom direction of FIGS. 3 and 4, and the recess 41 and the plug 23 are provided for each plug 11. The plugs 11 and 23 adjacent to each other in the top-to-bottom direction of FIGS. 3 and 4 are electrically insulated from each other. The plug 11, 23 and the recess 41 are not limited to be circular in plane figure as shown in FIGS. 3 and 4, but may be rectangular, for example.

Now in reference to the sectional views of FIGS. 1 to 10, the method of manufacturing the semiconductor device 1 will be described.

Figure 5:
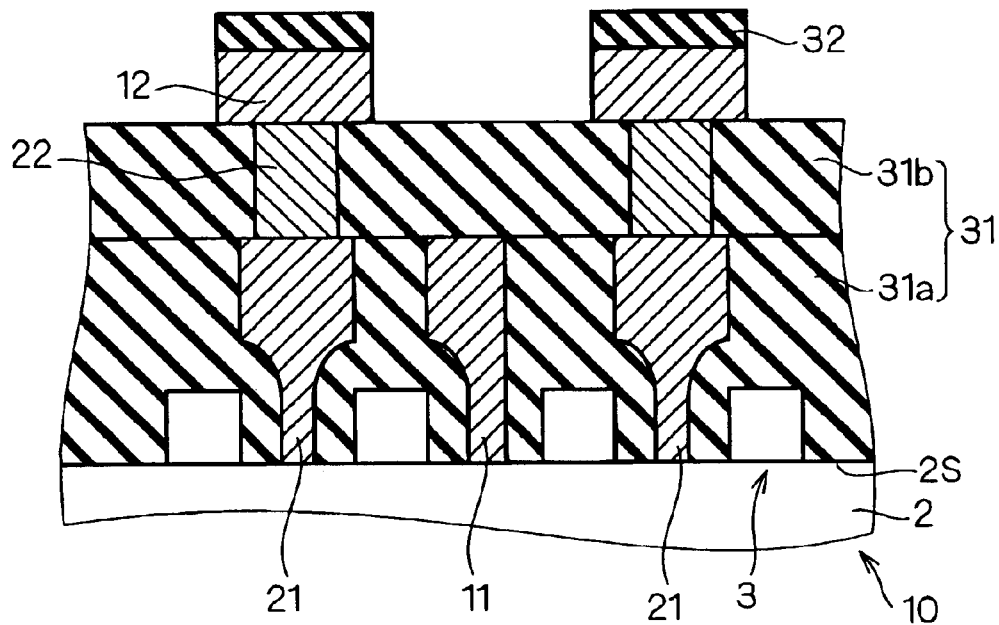

First, the semiconductor device in the state shown in FIG. 5 is prepared. Specifically, the lower interlayer insulation film 31a is formed on the underlying substrate 10. The contact holes are then formed in the lower interlayer insulation film 31a to form the plug (or first conductive portion) 11 and the plugs 21. Next, the upper interlayer insulation film 31b is formed to cover the plugs 11 and 21. With these steps, it is possible to provide the interlayer insulation film 31 on the underlying substrate 10 and to form the plug 11 in the interlayer insulation film 31 (see FIG. 5). The formation of the interlayer insulation film 31 and the plug 11 is not limited to the process described above, but various processes are applicable. Contact holes are then formed on the plugs 21 in the upper interlayer insulation film 31b to form the plugs 22.

Thereafter, a conductive film for the bit lines or bit line layer 12 is formed entirely on the interlayer insulation film 31 so as to be in contact with the plugs 22, and the silicon nitride film (or second insulation film) 32 is subsequently formed on the conductive film. At this time, the silicon nitride film 32 is formed to have the same plane pattern as the bit lines 12. The conductive film is then etched using the silicon nitride film 32 as a hard mask to pattern the bit lines or bit line layer (or second conductive portion) 12. Having the same plane pattern as the bit lines 12 as described above, the silicon nitride film 32 is formed leaving a space over the plug 11 and the vicinity thereof, so that the conductive film over the plug 11 and the vicinity thereof is subjected to etching. With the above described process, the semiconductor device shown in FIG. 5 is obtained.

Figure 6:
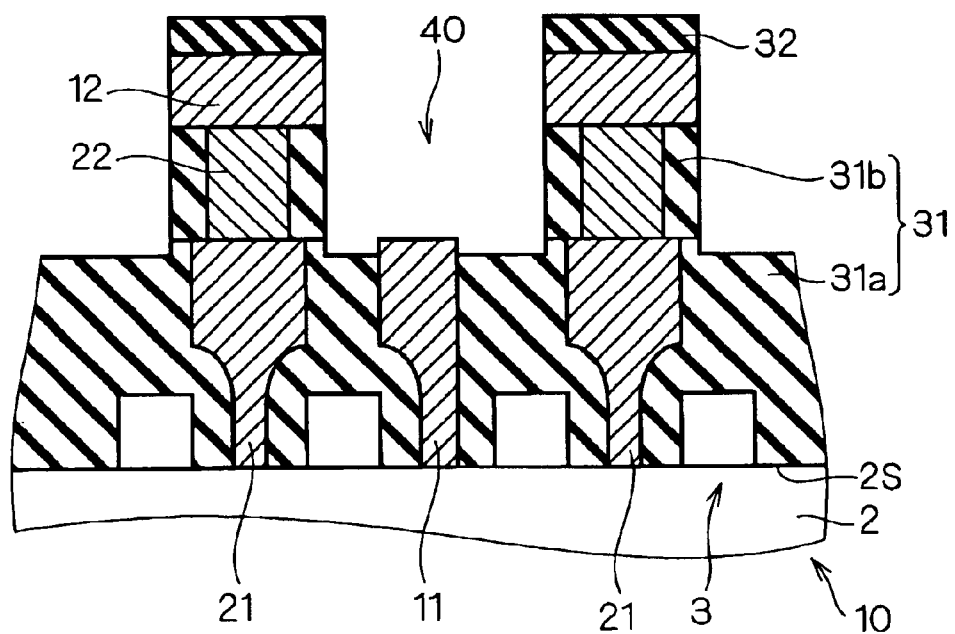

Next, as shown in FIG. 6, after patterning the bit line 12, the interlayer insulation film 31 is subjected to anisotropic dry etching using the silicon nitride film 32 again as a hard mask (i.e., selective etching with respect to the silicon nitride film 32). With this etching, the groove 40 is formed between and along the plane patterns of the silicon nitride film 32 and the bit line 12. The groove 40 is formed over the plug 11 in accordance with the plane pattern of the silicon nitride film 32, and the interlayer insulation film 31 is etched in this case such that the plug 11 projects into the groove 40 at the aforementioned height h3 (specifically, by not more than approximately 100 nm).

Figure 8:
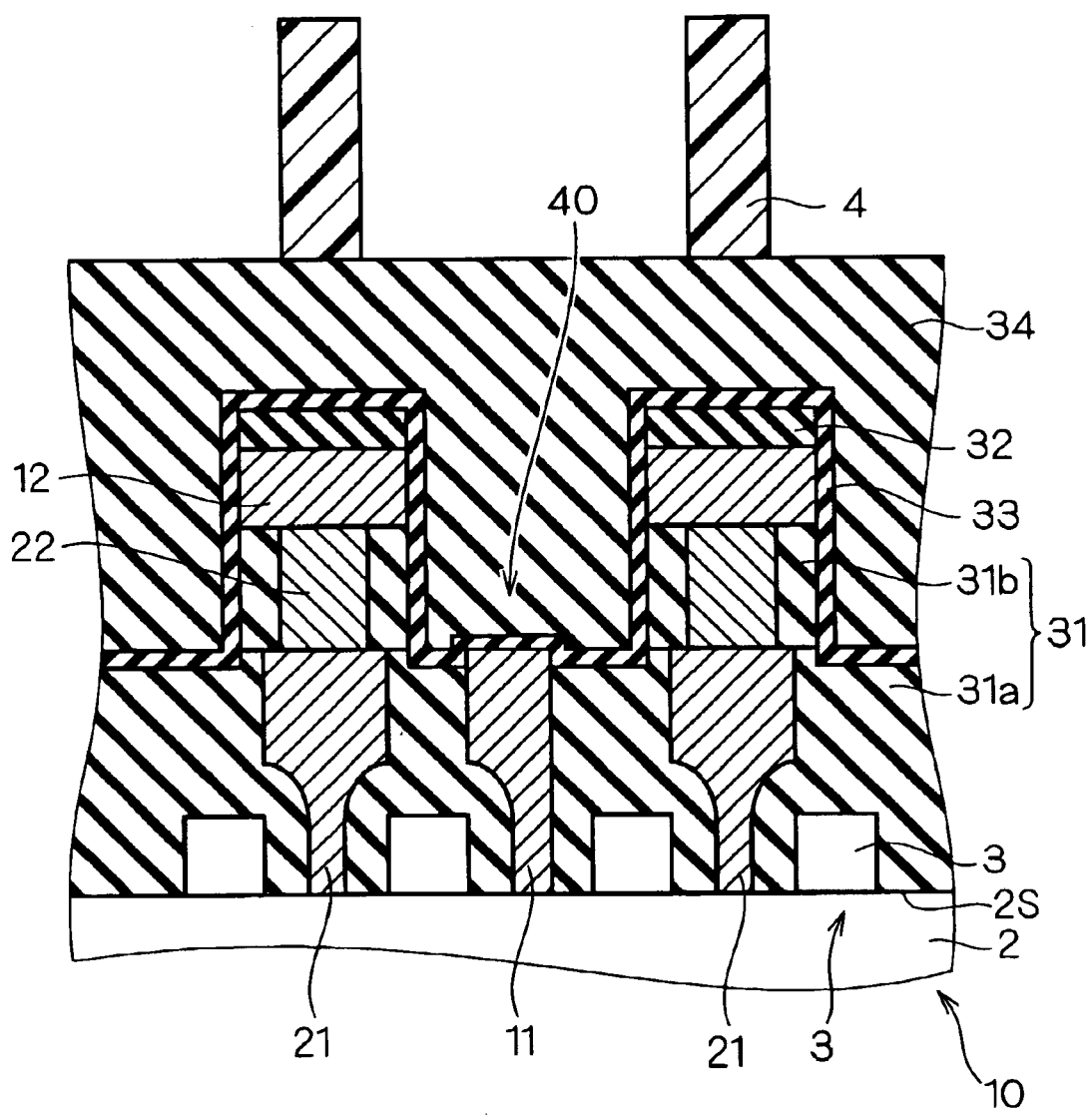

Thereafter, as shown in FIG. 7, a silicon nitride film (or third insulation film) 33 is formed so as to cover an exposed surface of the groove 40 (specifically, side and bottom faces of the groove 40 and an exposed part of the plug 11), the bit line 12 and the silicon nitride film 32. The nitride film 33 has a thickness of not more than approximately 10 nm. Further, as shown in FIG. 8, the interlayer insulation film (or fourth insulation film) 34 is entirely formed to fill the groove 40 and cover the silicon nitride film 33 (so as to lie over the bit line 12 and the silicon nitride film 32).

Figure 9:
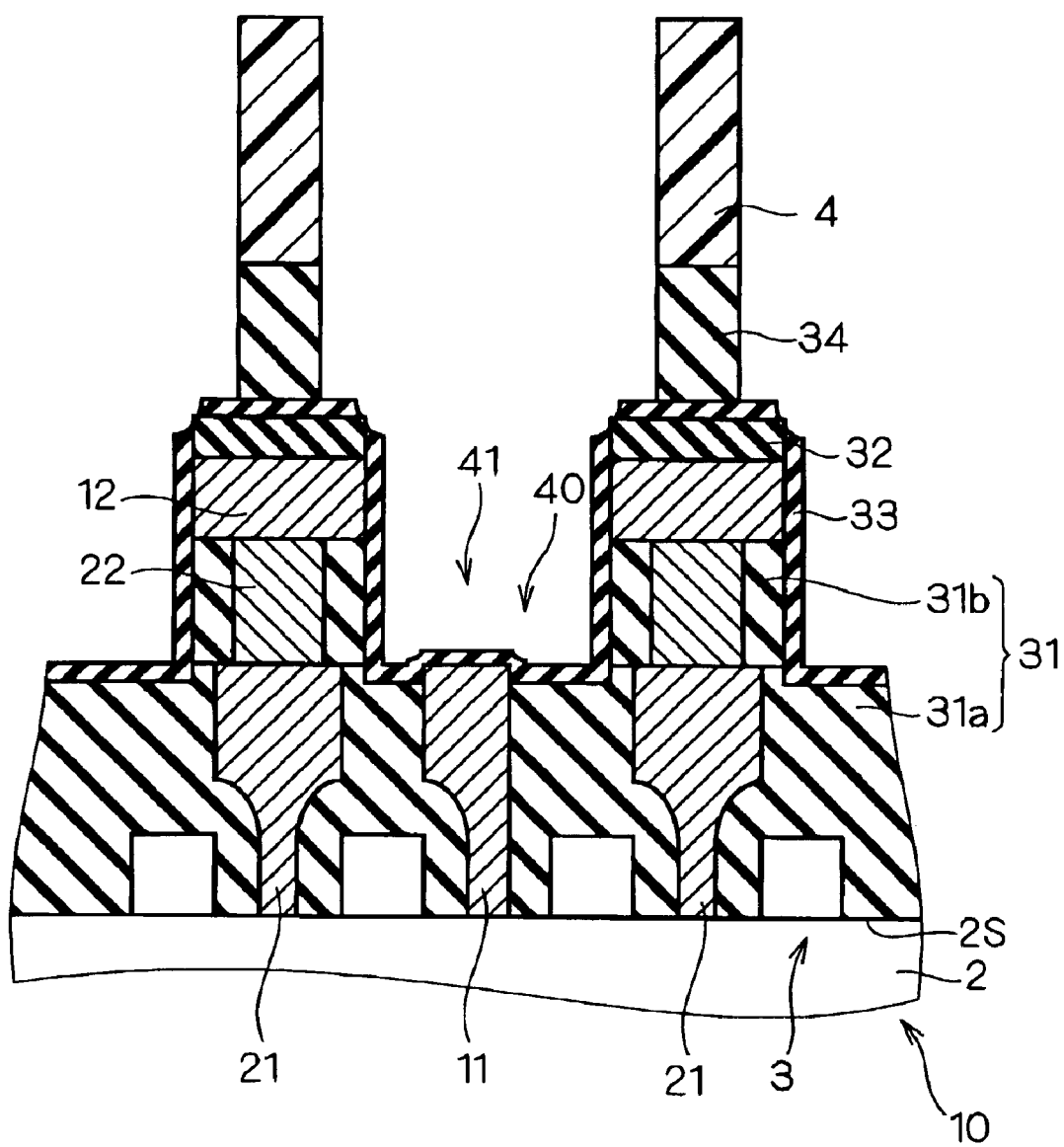

Next, a resist 4 is patterned on the interlayer insulation film 34. Specifically, the resist 4 is formed to have the same plane pattern as the interlayer insulation film 34 in the semiconductor device 1 in the state shown in FIG. 1. Thereafter, as shown in FIG. 9, the interlayer insulation film 34 is selectively subjected to anisotropic dry etching with respect to the silicon nitride films 33 and 32 using the resist 4 as a mask, thereby exposing the silicon nitride film 33 extending from inside the groove 40 to the shoulder of the silicon nitride film 32. With this etching, the recess 41 is formed over the plug 11. In short, the recess 41 is formed over the plug 11 using the silicon nitride films 33 and 32 as an etching stopper. For the interlayer insulation film 34, a material is employed which has a higher etch selectivity to the silicon nitride films 32, 33 than the interlayer insulation film 31. This etching step of the interlayer insulation film 34 corresponds to a forming step of a self-alignment contact (SAC) structure.

Figure 10:
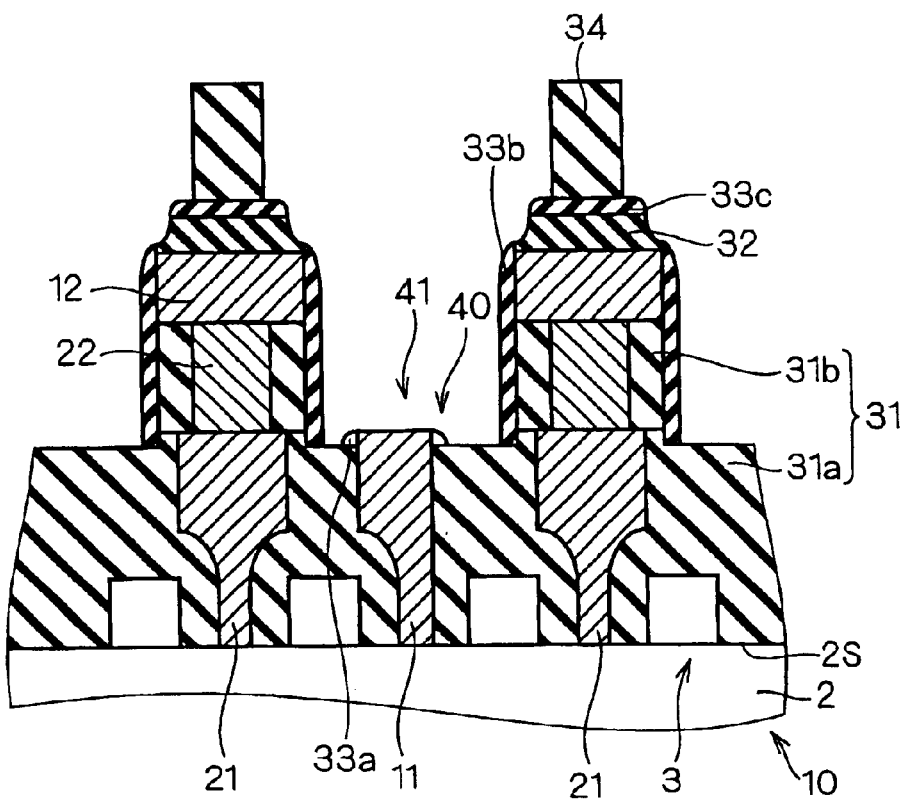

Thereafter, the silicon nitride film 33 on the plug 11 is subjected to anisotropic dry etching such that the plug 11 is exposed into the recess 41 (see FIG. 10). With the etching of the silicon nitride film 33 and that of the interlayer insulation film 34 as described above, the sidewall-shaped insulating portion 33a, the side covering insulating portion 33b and the top insulating portion 33c are formed from the silicon nitride film 33 as shown in FIG. 10. The etching of the silicon nitride film 33 is performed such that the sidewall-shaped insulating portion 33a does not exceed the projection height h3 of the plug 11 in the recess 41. After etching the silicon nitride film 33, the resist 4 is subjected to ashing.

A conductive film for the plug 23, made of polysilicon, for example, is formed in contact with the plug 11 so as to fill the recess 41 and extend over the interlayer insulation film 34. The conductive film is subjected to chemical mechanical polishing (CMP) or anisotropic etching until the interlayer insulation film 34 is exposed. The conductive film remaining after performing CMP constitutes the plug 23 (see FIG. 1). Although a detailed explanation of the manufacturing method thereafter is omitted, the storage node electrically connected to the plug 23 is formed by various manufacturing methods.

Figure 11:
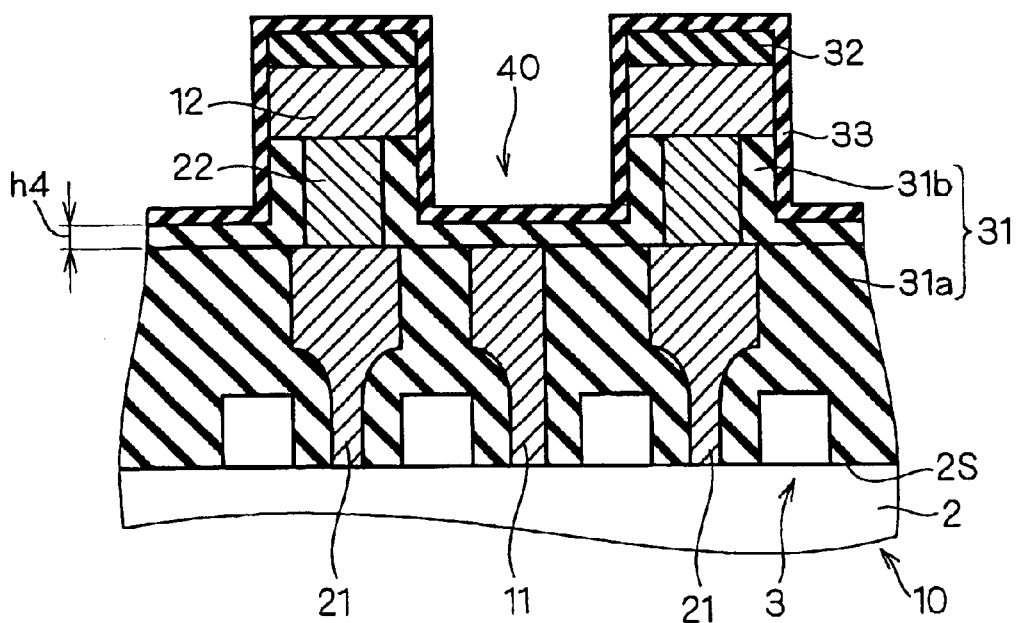

When forming the groove 40, the interlayer insulation film 31 may be left on the plug 11 as shown in FIG. 11. The remaining film is set at a thickness h4 of not more than approximately 100 nm.

Specifically, the groove 40 may be formed leaving the interlayer insulation film 31 on the plug 11, following which the silicon nitride film 33 is then formed to cover the exposed surface of the groove 40 (specifically, the side and bottom faces of the groove 40), the bit lines 12 and the silicon nitride film 32. After patterning the interlayer insulation film 34 (see FIG. 9), the silicon nitride film 33 over the plug 11 and the vicinity thereof is subjected to etching. Subsequently, the interlayer insulation film 31 remaining on the plug 11 is subjected to etching under the conditions for etching the silicon nitride film 33 to form the recess 41, thereby exposing the plug 11 (here, the plug 11 is caused to project into the recess 41 or groove 40 at the height h3). The etching of the interlayer insulation film 31 causes the groove 40 to extend farther at the position where the recess 41 is formed, which creates surface irregularities on the bottom face 31B of the groove 40. To the manufacturing method thereafter, the method already described is applicable.

Figure 12:
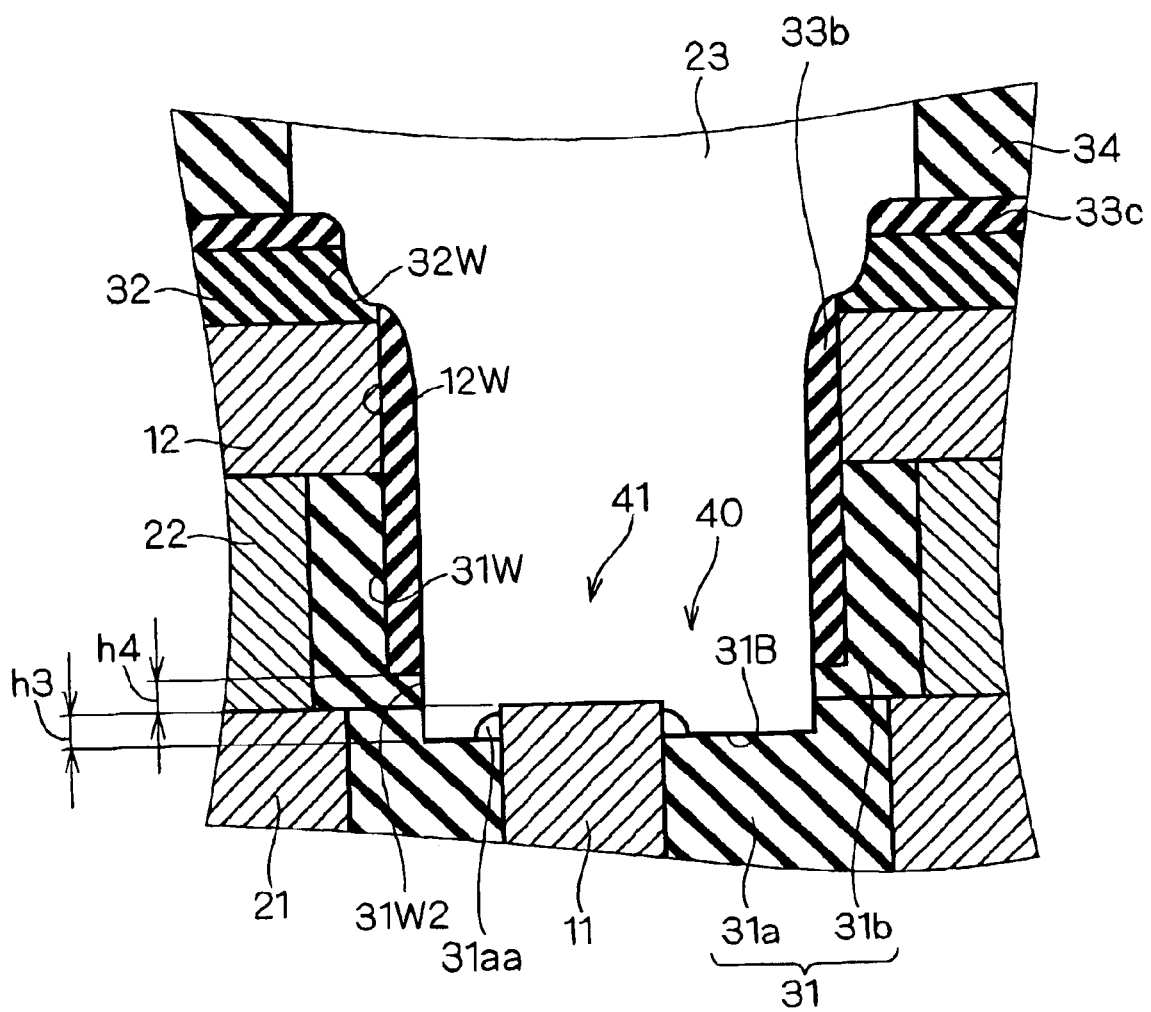

With this manufacturing method, as shown in FIG. 12, a sidewall-shaped insulating portion 31aa similar to the sidewall-shaped insulating portion 33a (FIG. 2) is formed from the interlayer insulation film 31. The side covering insulating portion 33b (FIG. 2) is shorter than in the aforementioned manufacturing method in a direction perpendicular to the substrate surface 2S. At this time, the groove 40 formed in the interlayer insulation film 31 has a side face 31W2 that makes a step difference with the aforementioned side face 31W and continues smoothly to a surface of the side covering insulating portion 33b (i.e., a surface on the side of the recess 41). In short, the bottom face 31B is formed narrower at the position where the recess 41 is formed.

Figure 13:
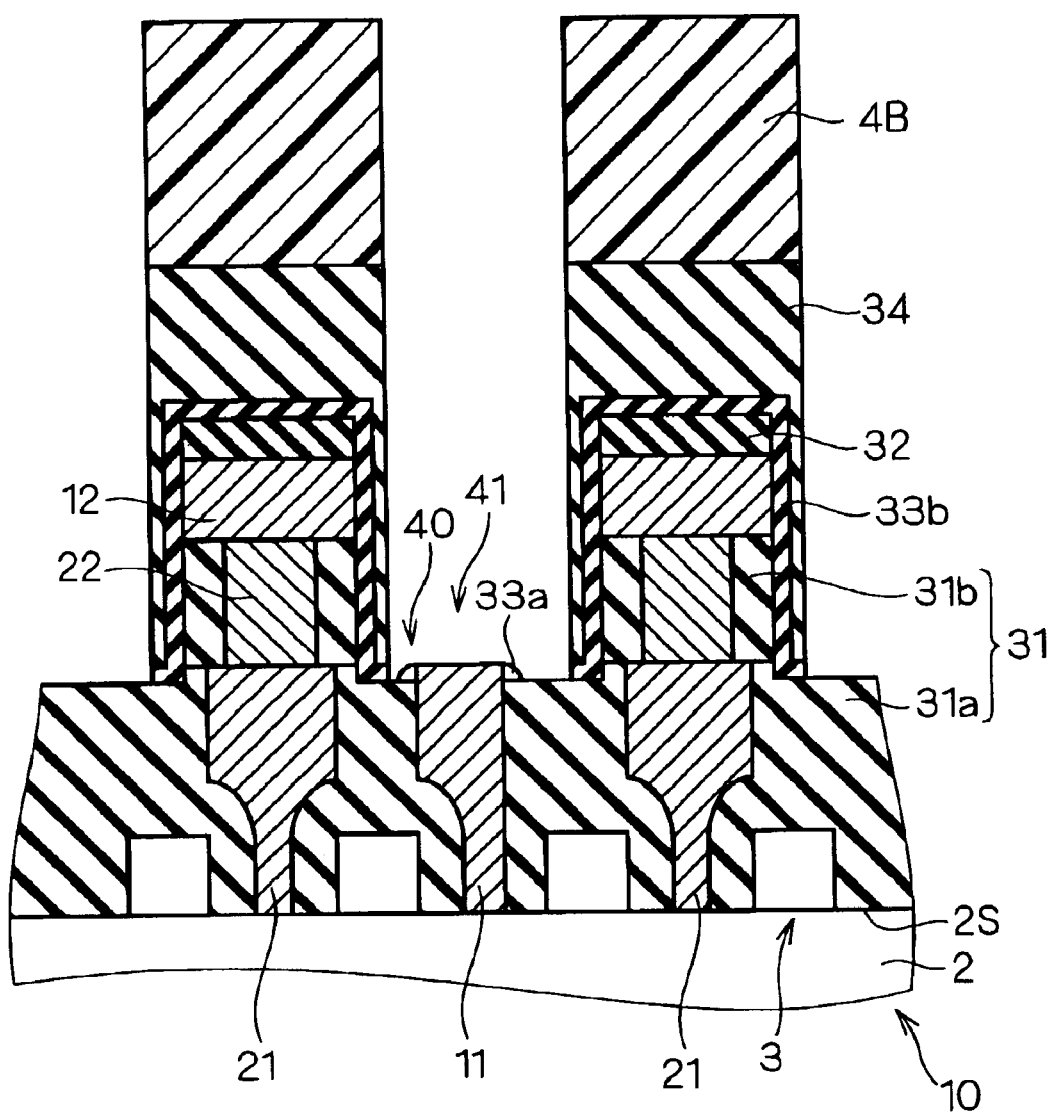

The interlayer insulation film 34 over the plug 11 may be etched without using the SAC method unlike the aforementioned manufacturing method. Specifically, as shown in FIG. 13, the silicon nitride film 33 and the interlayer insulation film 34 over the plug 11 are subjected to etching using a resist 4B provided on the interlayer insulation film 34 as a mask, thereby exposing the plug 11. At this time, an opening of the resist 4B is set smaller than the spacing of the pattern of the bit lines 12 such that part of the silicon nitride film 33 that entirely covers the side face 32W of the silicon nitride film 32, the side face 12W of the bit line 12 and the side face 31W of the groove 40 are not subjected to etching. The part that accordingly remains constitutes the side covering insulating portion 33b. To the manufacturing method thereafter, the method already described is applicable.

The aforementioned semiconductor device 1 and the manufacturing method thereof can achieve the following effects.

Figure 14:
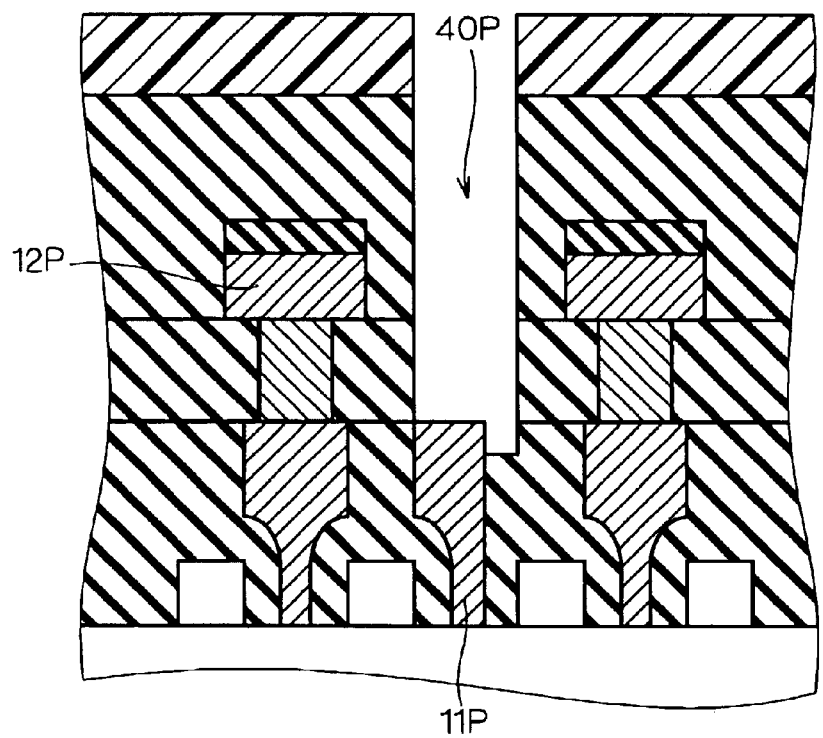
FIG. 14 is a sectional view showing a conventional semiconductor device.
Figure 15:
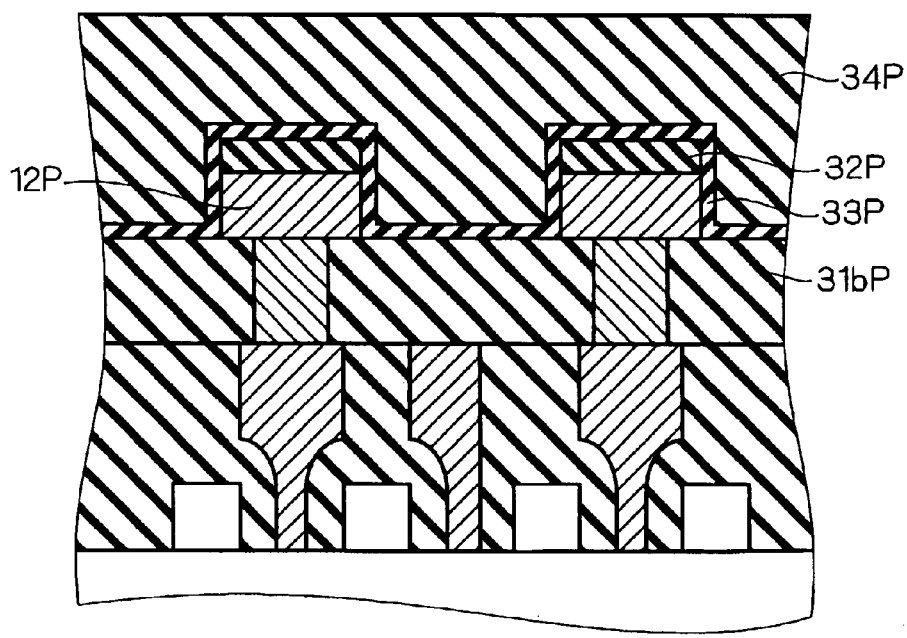
FIGS. 15 through 18 are sectional views showing a conventional self-alignment contact method.

First, the etching of the interlayer insulation film 31 using the silicon nitride film 32 formed on the bit line (layer) 12 as a mask (thereby forming the groove 40) allows the groove 40 to extend through the spacing of the plane pattern of the bit lines 12 and the silicon nitride film 32. Therefore, the groove 40 is formed not only larger than the conventional minute hole 40P (FIG. 14) formed in part of the region in the spacing of the plane pattern but also in a self-aligned manner. Thus, the groove 40 can be formed with better controllability in shape than the conventional hole 40P. Further, the use of the silicon nitride film 32 (as a mask) in common for forming the bit line 12 and the groove 40 allows reductions in manufacturing time and manufacturing costs.

Further, it has been ascertained by experiments conducted by the inventors of the present invention that the above-described method of forming the groove 40 can reduce the extent that the shoulder of the silicon nitride film 32 is etched as compared to the conventional SAC method in which the minute hole 40P (FIGS. 16–18) is formed.

One of factors contributing such result lies in that the groove 40 is larger than the minute hole 40P. Specifically, the groove 40 is larger than the minute hole 40P (i.e., larger in opening area), so that a defective opening is unlikely to occur as compared to the minute hole 40P even under etching conditions having a higher etch selectivity between nitride films and silicon oxide films. In other words, such etching conditions can be used to form the groove 40, allowing a reduction in the extent that the shoulder of the silicon nitride film 32 is etched. Further, since the aforementioned etching conditions can be used, or since the formation of the groove 40 does not require fine patterning such as that for the conventional minute hole 40P, etching takes less time than in the conventional SAC method. Thus, the silicon nitride film 32 is subjected to etching only for a short period of time when forming the groove 40, allowing a reduction in the extent that the shoulder of the silicon nitride film 32 is etched.

Figure 16:
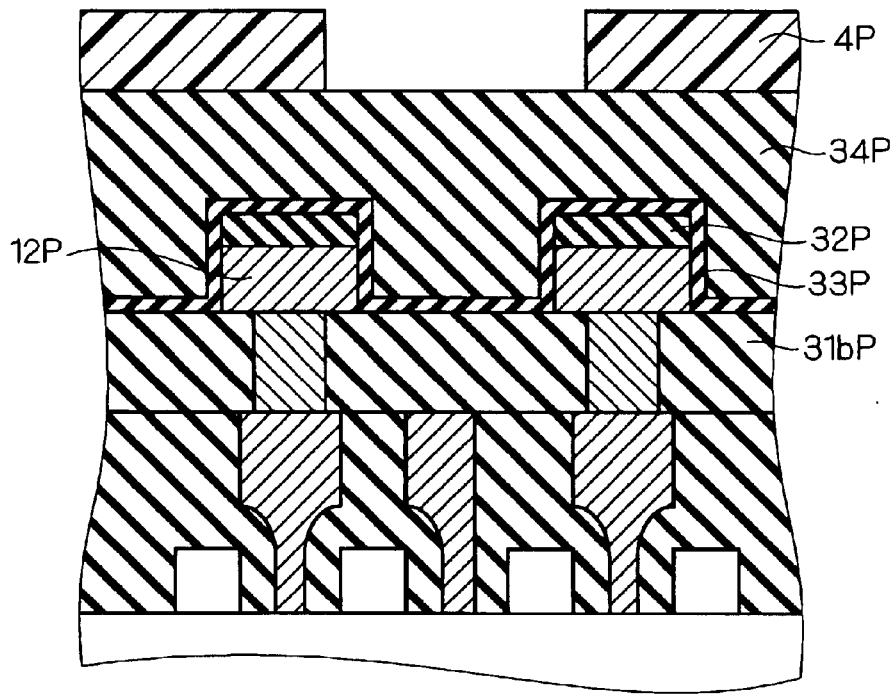
Figure 17:
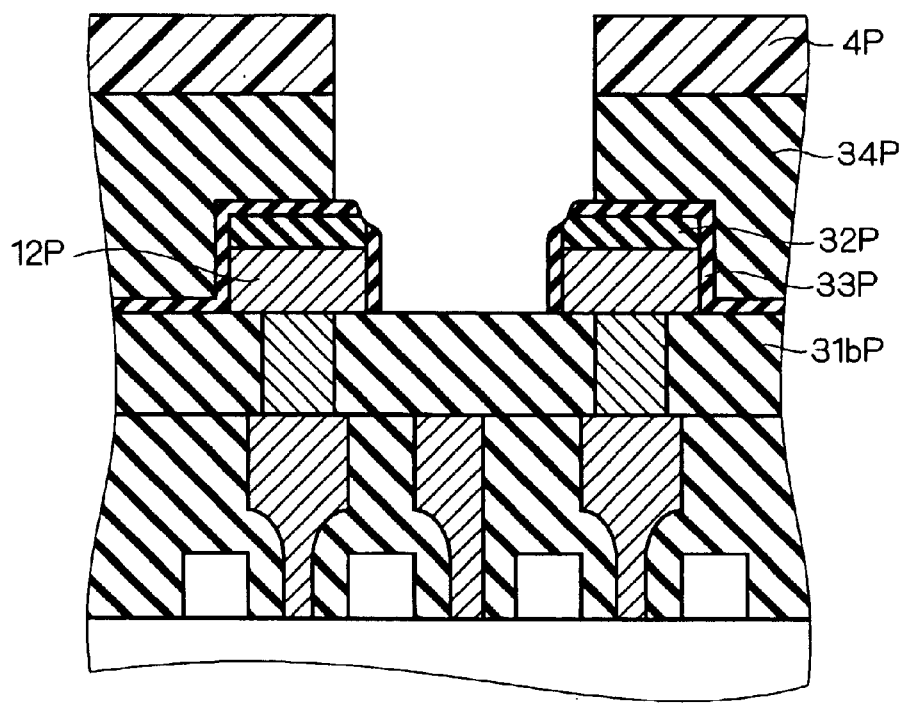
Figure 18:
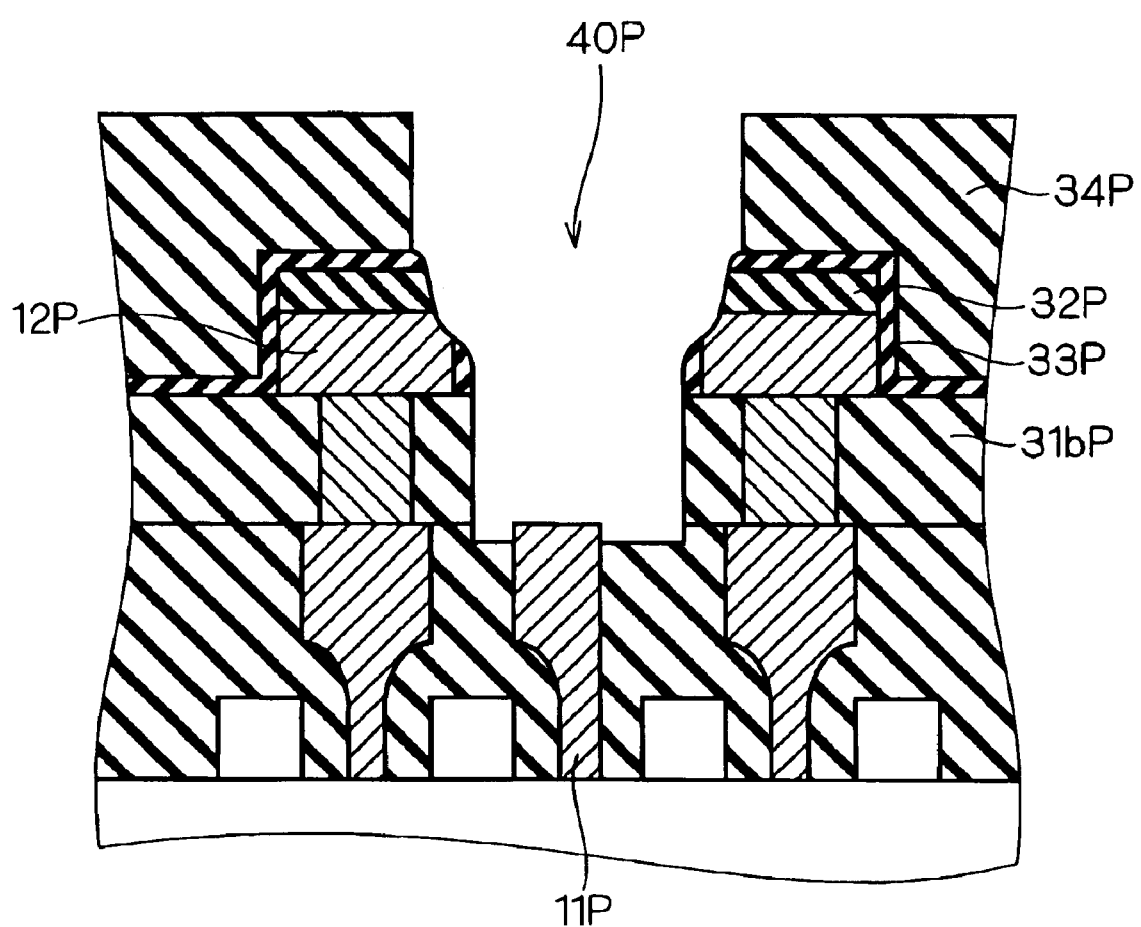

Another factor lies in that the groove 40 is formed prior to forming the silicon nitride film 33 and the interlayer insulation film 34. Specifically, as shown in FIGS. 16 to 18, in the conventional SAC method, the shoulders of the silicon nitride films 33P and 32P are subjected to the etching of the interlayer insulation film 34P, the silicon nitride film 33P and the interlayer insulation film 31bP. On the other hand, as shown in FIGS. 5 and 6, the shoulder of the silicon nitride film 32 is only subjected to the etching of the interlayer insulation film 31b and part of the interlayer insulation film 31a. As described, etching takes less time than in the conventional SAC method (and a further reduction in etch time is possible using the aforementioned etching conditions having a higher etch selectivity), so that the silicon nitride film 32 is subjected to etching only for a short period of time in forming the groove 40, allowing a reduction in the extent that the shoulder of the silicon nitride film 32 is etched.

Further, after the groove 40 formed by etching the interlayer insulation film 31 is filled with the interlayer insulation film 34, the recess 41 is formed in the interlayer insulation film 34. Accordingly, it has been ascertained by experiments conducted by the inventors of the present invention that the extent that the shoulders of the silicon nitride films 33 and 32 are etched can be reduced as compared to the conventional SAC method in which the minute hole 40P (see FIG. 18) is directly formed on the interlayer insulation films 34P and 31bP (FIG. 18).

One of factors creating such effects may be attributed to that the number that the shoulders of the silicon nitride films 33 and 32 are subjected to etching is less than in the conventional SAC method (see FIGS. 15 to 18). Specifically, the shoulders of the silicon nitride films 33P and 32P are subjected to the etching of the interlayer insulation film 34P, the silicon nitride film 33P and the interlayer insulation film 31bP in the conventional SAC method (i.e., three times in total), whereas the shoulders of the silicon nitride films 33 and 32 are subjected to the etching of the interlayer insulation film 34 and the silicon nitride film 33 in the manufacturing method of the present embodiment (i.e., twice in total).

As described above, the extent that the shoulders of the silicon nitride films 33 and 32 are subjected to etching can be reduced, allowing the shoulder of the bit line 12 to be covered with the silicon nitride films 33 and 32 of a sufficient thickness even after the recess 41 is formed. At this time, since the silicon nitride film 33 is formed in a thickness of not more than approximately 10 nm, it is possible to cover the side face 12W of the bit line 12 with the side covering insulating portion 33b of a sufficient thickness even after the recess 41 is formed. This allows the bit line 12 to be insulated from the plug 23 with more reliability.

Furthermore, the presence of the sidewall-shaped insulating portions 33a and 31aa allows the plug 23 to cover the plug 11 with good step coverage, which ensures an electric contact between the plugs 11 and 23. At this time, setting the height of the sidewall-shaped insulating portions 33a and 31aa lower than the projection height h3 of the plug 11 can increase the area in which the plug 11 is exposed as compared to the case of only exposing a top surface of the plug 11. This can increase the area in which the plugs 11 and 23 are in contact with each other, thereby achieving a more reliable electric contact between the plugs 11 and 23.

Setting the projection height h3 of the plug 11 in the groove 40 at not more than approximately 100 nm allows the silicon nitride film 32 of a sufficient thickness to be left even after the groove 40 is formed. Thus, sufficient compatibility can be attained between the effect of ensuring an electric contact between the plugs 11 and 23 because of the improvement in step coverage and that of insulating the bit line 12 from the plug 23 with more reliability.

When causing the plug 11 to project into the groove 40, the silicon nitride film 33 is formed to cover the plug 11, so that the etching of two layers, the interlayer insulation film 34 and the silicon nitride film 33, allows the plug 11 to be exposed. This can reduce the number of changes in etching conditions for exposing the plug 11 as compared to the case of forming three layers, the interlayer insulation film 31bP/etching stopper film 33P/interlayer insulation film 34P, on the plug 11P as in the conventional SAC method shown in FIGS. 15 to 18. This allows manufacturing time to be reduced as compared to the conventional SAC method.

On the other hand, in the case of forming the groove 40 leaving the interlayer insulation film 31 on the plug 11 (see FIG. 11), the interlayer insulation film 31 left on the plug 11 is subjected to etching under the same condition for etching the silicon nitride film 33 to expose the plug 11. At this time, the interlayer insulation film 31 left on the plug 11 is set at a thickness of not more than approximately 100 nm. Thus, the remaining interlayer insulation film 31 may sufficiently be etched also under the same condition for etching the silicon nitride film 33. Therefore, the number of changing the etching conditions for exposing the plug 11 can be reduced as compared to the case of forming the three layers, interlayer insulation film 31bP/etching stopper film 33P/interlayer insulation film 34P, on the plug 11P as in the conventional SAC method shown in FIGS. 15 to 18. This allows manufacturing time to be reduced as compared to the conventional SAC method.

When a practical etch selectivity can be set among the aforementioned silicon nitride films (second and third insulation films) 32, 33, the interlayer insulation films (first and fourth insulation films) 31 and 34, the films 31 to 34 are not limited to the materials as described above. The film 32 may be made of a different material from the film 33, and the film 31 may be made of a different material from the film 34.

In the case of further forming multi-level interconnection and the like on the semiconductor device 1 in the state shown in FIG. 1, the semiconductor device 1 may be considered as an "underlying substrate". In other words, various substrates for forming the first insulation film, the first conductive portion and the like correspond to the underlying substrate.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising the steps of:
   (a) forming a first insulation film on an underlying substrate and providing a first conductive portion in said first insulation film;
   (b) forming a conductive film on said first insulation film;
   (c) forming a second insulation film selectively on said conductive film, so that said second insulation film does not exist over said first conductive portion at all;
   (d) patterning said conductive film using said second insulation film as a mask to form a second conductive portion; and
   (e) etching said first insulation film using said second insulation film as a mask after said step (d) to form a groove in said first insulation film.

2. A method of manufacturing a semiconductor device comprising the steps of:
   (a) forming a first insulation film on an underlying substrate and providing a first conductive portion in said first insulation film;
   (b) forming a conductive film on said first insulation film;
   (c) forming a second insulation film on said conductive film leaving a space over said first conductive portion;
   (d) patterning said conductive film using said second insulation film as a mask to form a second conductive portion;
   (e) etching said first insulation film using said second insulation film as a mask after said step (d) to form a groove in said first insulation film;

(f) forming a third insulation film covering an exposed surface of said groove, said second conductive portion and said second insulation film;

(g) forming a fourth insulation film having a higher selectivity to said second and third insulation films than said first insulation film so as to cover said third insulation film and fill said groove; and (h) selectively etching said fourth insulation film with respect to said third and second insulation films to expose said third insulation film extending from inside said groove to a shoulder of said second insulation film, thereby forming a recess over said first conductive portion.

3. The method of manufacturing a semiconductor device according to claim 2, wherein said step (f) includes the step of
(f-1) forming said third insulation film in a thickness of not less than approximately 10 nm.

4. The method of manufacturing a semiconductor device according to claim 2, wherein said step (e) includes the step of
(e-1) causing said first conductive portion to project into said groove, said step (f) includes the step of
(f-2) forming said third insulation film so as to cover an exposed part of said first conductive portion as well, said method further comprising the step of
(i) performing anisotropic etching of said third insulation film after said step (h) to expose said first conductive portion.

5. The method of manufacturing a semiconductor device according to claim 4, wherein said step (i) includes the step of
(i-1) making said third insulation film in contact with said first conductive portion lower in height than a projection of said first conductive portion.

6. The method of manufacturing a semiconductor device according to claim 4, wherein said step (e-1) includes the step of
(e-1-1) causing said first conductive portion to project into said groove at a height of not more than approximately 100 nm.

7. The method of manufacturing a semiconductor device according to claim 2, wherein said step (e) includes the step of
(e-2) forming said groove leaving said first insulation film on said first conductive portion, said method further comprising the steps of:
(j) etching said third insulation film over said first conductive portion, and
(k) following said step (j), etching said first insulation film left on said first conductive portion under the same etching condition at said step (j) to expose said first conductive portion.

8. The method of manufacturing a semiconductor device according to claim 7, wherein said step (e-2) includes the step of
(e-2-1) forming said groove leaving said first insulation film on said first conductive portion in a thickness of not more than approximately 100 nm.

* * * * *